United States Patent
Takamura

(10) Patent No.: US 7,030,427 B2
(45) Date of Patent: Apr. 18, 2006

(54) SOLID-STATE IMAGING DEVICE AND METHOD OF MANUFACTURING THE SAME

(75) Inventor: Takashi Takamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/790,868

(22) Filed: Mar. 3, 2004

(65) Prior Publication Data

US 2004/0217351 A1 Nov. 4, 2004

(30) Foreign Application Priority Data

Mar. 10, 2003 (JP) ............................. 2003-062754

(51) Int. Cl.
*H01L 31/0328* (2006.01)

(52) U.S. Cl. ............... 257/184; 257/186; 257/187; 257/192; 257/201; 257/292; 257/461

(58) Field of Classification Search ............. 257/184, 257/187, 218, 222, 226, 231, 257
See application file for complete search history.

(56) References Cited

U.S. PATENT DOCUMENTS 6,051,857 A  4/2000 Miida 6,781,178 B1 * 8/2004 Shizukuishi ............... 257/296

FOREIGN PATENT DOCUMENTS

| JP | 02-180071 | 7/1990 |
|---|---|---|
| JP | A 11-195778 | 7/1999 |
| JP | 2001-298662 | 10/2001 |
| JP | 2002-16242 | 1/2002 |
| JP | 2002-353431 | 12/2002 |

* cited by examiner

*Primary Examiner*—Long Pham
*Assistant Examiner*—Wai-Sing Louie
(74) *Attorney, Agent, or Firm*—Oliff & Berridge, PLC

(57) ABSTRACT

The invention provides a solid-state imaging device that can include a pixel array having a plurality of pixels arranged in a matrix. The pixels can each include a photo diode that generates carriers depending on the intensity of incident light, an accumulation region that accumulates the generated carriers, an insulated-gate output transistor that outputs a signal according to threshold voltage that changes depending on the number of carriers accumulated in the accumulation region, and an insulated-gate clear transistor that discharges carriers accumulated in the accumulation region. The carriers accumulated in the accumulation region are discharged through a channel region of the clear transistor. Accordingly, the invention can provide a technique where carriers in an accumulation region can be easily discharged.

6 Claims, 11 Drawing Sheets

SOLID-STATE IMAGING DEVICE AND METHOD OF MANUFACTURING THE SAME

CROSS-REFERENCE TO RELATED APPLICATION

The disclosure of Japanese Patent Application No. 2003-062754 filed Mar. 10, 2003 including the specification, drawings, and claims is incorporated herein by reference in its entirety.

BACKGROUND OF THE INVENTION

1. Field of Invention

The present invention relates to a solid-state imaging device of a threshold voltage modulation system.

2. Description of Related Art

In recent years, mobile electronic equipment, such as cellular phones and digital cameras, have been equipped with a small solid-state imaging device. As such a solid-state imaging device, a MOS solid-state imaging device of a threshold voltage modulation system has been developed.

The MOS solid-state imaging device of a threshold voltage modulation system can include a plurality of pixels arranged in a matrix. Each of the pixels includes a single of photo diode and a single of transistor. An accumulation region referred to as a hole pocket, where holes tend to be collected, is formed below a gate electrode of the transistor. The photo diode generates holes depending on the intensity of incident light. The generated holes are accumulated in the accumulation region. The threshold voltage of the transistor changes depending on the number of holes accumulated in the accumulation region. Then, source voltage depending on the intensity of incident light, namely pixel data is obtained by reading out the source voltage that changes in response to the change of the threshold voltage. Using a plurality of pixel data corresponding to the plurality of pixels allows one image data to be produced. Details about the MOS solid-state imaging device of a threshold voltage modulation system are disclosed in, for example, Japanese Unexamined Patent Application Publication No. 11-195778 and the like.

SUMMARY OF THE INVENTION

Meanwhile, in a MOS solid-state imaging device of a threshold voltage modulation system, holes already existing in an accumulation region need to be discharged (cleared) before an image is picked up. In other words, holes are accumulated in an accumulation region. Holes in an accumulation region were conventionally discharged toward the depth direction of a substrate by applying relatively high voltage to a gate electrode of a transistor.

In order to completely discharge holes in an accumulation region using the conventional method, however, high voltage of about 10V is required. For this reason, a MOS solid-state imaging device of a threshold voltage modulation system that can discharge holes with low voltage has been required.

In view of the above problem of the conventional art, this invention is intended to provide a technique where carriers in an accumulation region can be discharged with relatively low voltage.

In view of the above-described problem, a device of an embodiment of the present invention is a solid-state imaging device that includes a pixel array having a plurality of pixels arranged in a matrix. Each of the pixels includes a photo diode that generates carriers depending on the intensity of incident light and an accumulation region that accumulates the generated carriers. Each of the pixels also can include an insulated-gate output transistor that outputs a signal according to threshold voltage that changes depending on the number of carriers accumulated in the accumulation region and an insulated-gate clear transistor that discharges carriers accumulated in the accumulation region, the accumulated carriers being discharged through a channel region of the clear transistor.

In this device, each of the pixels can have the clear transistor such that carriers in the accumulation region can be easily discharged through the channel region of the clear transistor. In addition, the accumulation region preferably functions as a source region of the clear transistor.

In the device, each of the pixels preferably includes a pixel-forming region of a second conductivity type that is formed on a semiconductor substrate of a first conductivity type and where one of the pixels is formed and a buried region of a first conductivity type that is formed in the pixel-forming region. The buried region includes a first partial buried region formed at a relatively deep position and having a relatively low impurity concentration and a second partial buried region formed at a relatively shallow position and having a relatively high impurity concentration. A junction region between the first partial buried region and the pixel-forming region forms the photo diode. The second partial buried region forms the accumulation region. Each of the pixels also includes a discharging region of a first conductivity type that is formed in the pixel-forming region and into which carriers discharged from the accumulation region flow. The output transistor preferably includes a first gate electrode that is formed over the pixel-forming region above the accumulation region through an insulating film. The clear transistor preferably includes a second gate electrode that is formed over the pixel-forming region between the buried region and the discharging region.

This can make the structure of the pixels relatively simple. Specifically, the buried region functions as the accumulation region as well as one of semiconductor regions of the photo diode. In addition, the buried region including the accumulation region also functions as the source region of the clear transistor.

In the device, the first gate electrode preferably has a substantially annular shape. The output transistor preferably includes a source region that is formed inside the first gate electrode and a drain region that is formed outside the first gate electrode. This can further simplify the structure of the pixels.

In the device, the pixel-forming region preferably can include a lower region that is formed below the buried region and a side region that is formed at the side of the buried region. The impurity concentration of the lower region is preferably higher than the impurity concentration of the side region.

In addition, in the device, the pixel-forming region preferably includes a lower region that is formed below the buried region and a side region that is formed at the side of the buried region. The thickness of the lower region is preferably larger than the thickness of the side region. Accordingly, this can prevent carriers from flowing into the buried region from the lower region so as to improve the image quality of produced images.

In the device, the first conductivity type may be a p-type, and the second conductivity type may be an n-type. The carriers may be holes. This can enable each of the pixels to accumulate holes generated in the photo diode in the accumulation region.

A method of an embodiment of the present invention can be a method of manufacturing a solid-state imaging device that includes a pixel array where pixels are arranged in a matrix. Here, the pixels have a photo diode that generates carriers depending on the intensity of incident light, and an accumulation region that accumulates the generated carriers. The pixels also have an insulated-gate output transistor that outputs a signal according to threshold voltage that changes depending on the number of carriers accumulated in the accumulation region, and an insulated-gate clear transistor that discharges carriers accumulated in the accumulation region. The accumulated carriers are discharged through a channel region of the clear transistor.

The method can include the steps of preparing a semiconductor substrate of a first conductivity type that includes a pixel-forming region of a second conductivity type where one of the pixels is formed and a buried region of a first conductivity type that is formed in the pixel-forming region. The buried region can include a lower region formed at a relatively deep position and having a relatively low impurity concentration and an upper region formed at a relatively shallow position and having a relatively high impurity concentration. A junction region between the lower region and the pixel-forming region forms the photo diode. The method can also include the step of forming a first gate electrode constituting the output transistor and a second gate electrode constituting the clear transistor, over the pixel-forming region through an insulating film. The first gate electrode is formed above the buried region. The second gate electrode is formed above an end of the buried region. The method further can include the step of leaving the accumulation region having a relatively high impurity concentration below the first gate electrode by utilizing a region including the first gate electrode as a mask and doping an impurity in the upper region. The impurity inverts the conductivity type of the upper region. The method also can include the step of forming a discharging region of a first conductivity type into which carriers discharged from the accumulation region flow, in the pixel-forming region. The discharging region is formed in a region that faces the buried region through the second gate electrode.

The order between the step of leaving the accumulation region and the step forming a discharge region may be reversed. In addition, the step of leaving the accumulation region may be implemented in the middle of the step forming a discharge region.

This method enables the device of the present invention to be manufactured. Furthermore, in the manufactured device, each of the pixels has the clear transistor such that carriers in the accumulation region can be easily discharged through the channel region of the clear transistor.

In addition, in the manufactured device, the accumulation region can be formed below the first gate electrode in a self-aligned manner since the first gate electrode is utilized as a mask. Therefore, the relationship between the positions of the first gate electrode and the accumulation region, which are included in each of the pixels, can be almost constant. As a result, the deterioration of image quality can be avoided.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments of the present invention will be described below.

Figure 1:
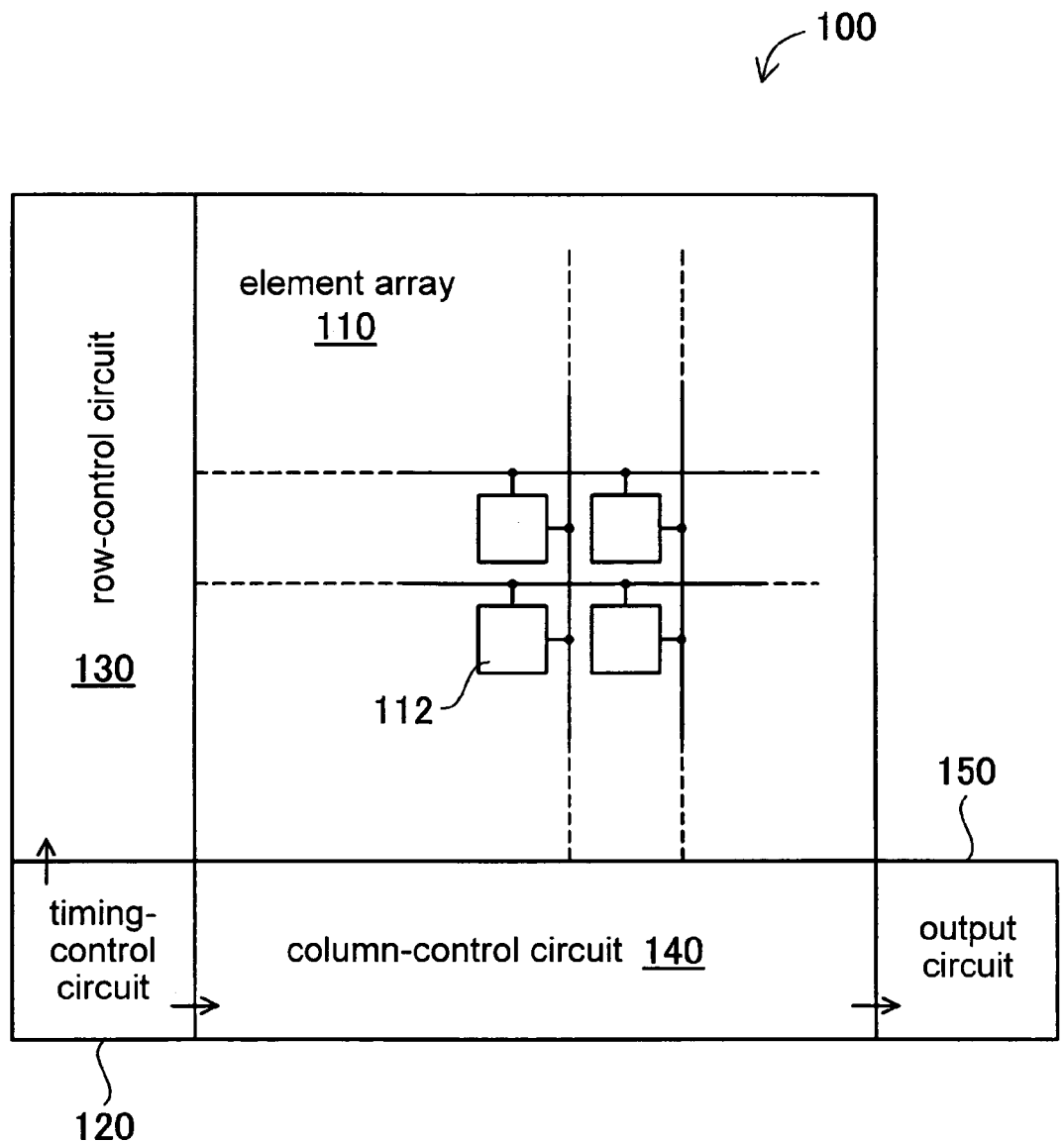
FIG. 1 is an explanatory diagram showing the whole structure of a solid-state imaging device as an embodiment of the present invention.

A. Structure of Solid-State Imaging Device:

FIG. 1 is an explanatory diagram showing the whole structure of a solid-state imaging device. A solid-state imaging device 100 can include a pixel array 110 having a plurality of pixels 112 that are arranged in a matrix, a timing-control circuit 120, a row-control circuit 130, a column-control circuit 140, and an output circuit 150.

The timing-control circuit 120 provides a timing signal becoming the standard of operation to the row-control circuit 130 and the column-control circuit 140. The row-control circuit 130 selects a single row among a plurality of rows in response to the given timing signal. Meanwhile, the column-control circuit 140 sequentially selects a single column among a plurality of columns in response to the given timing signal. This enables any one of pixels to be selected among the plurality of pixels arranged in a matrix, and thereby a signal can be read out from the selected pixel.

Figure 2:
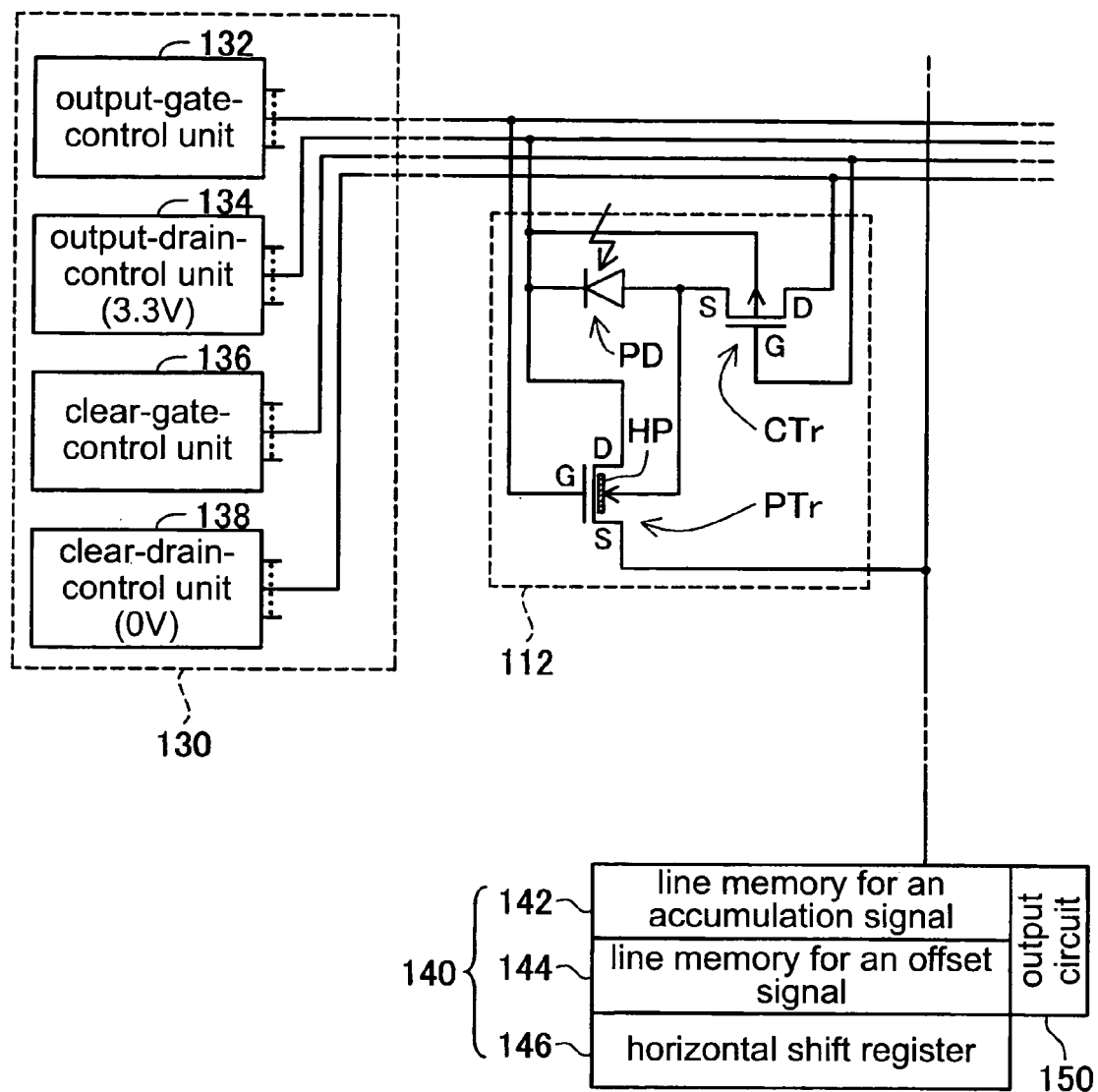
FIG. 2 is an explanatory diagram showing the internal structures of a pixel array 110, a row-control circuit 130, and a column-control circuit 140, of FIG. 1.

FIG. 2 is an explanatory diagram showing the internal structures of the pixel array 110, the row-control circuit 130, and the column-control circuit 140, of FIG. 1. FIG. 2, however, is represented with focus on only one of the pixels 112.

As shown in the diagram, each of the pixels 112 includes a photo diode PD, an output transistor PTr, and a clear transistor CTr. Furthermore, a hole pocket HP where holes tend to be collected is formed below a gate electrode of the output transistor PTr.

A drain region of the output transistor PTr is electrically coupled to a cathode of the photo diode PD and a substrate region of the clear transistor CTr (namely, a semiconductor region below a gate electrode of the clear transistor). Meanwhile, a source region of the clear transistor CTr is electrically coupled to an anode of the photo diode PD and a substrate region of the output transistor PTr that includes the hole pocket HP (namely, a semiconductor region below a gate electrode of the output transistor).

The gate electrode, the drain region, and a source region of the output transistor PTr will be also referred to as output gate, output drain, and output source hereinafter, respectively. In addition, the gate electrode, a drain region, and the source region of the clear transistor CTr will be also referred to as clear gate, clear drain, and clear source hereinafter, respectively.

The photo diode PD generates pairs of electrons and holes by photoelectrically converting incident light. The number of generated pairs of electrons and holes becomes larger as the intensity of incident light becomes stronger. The hole pocket HP accumulates holes generated in the photo diode PD. The threshold voltage of the output transistor PTr changes depending on the number of holes accumulated in the hole pocket HP. As a result, the output transistor PTr can output source voltage depending on the intensity of incident light. The clear transistor CTr discharges holes accumulated in the hole pocket HP after source voltage is output. More details about the operation of the pixels will be described in greater detail below.

The row-control circuit 130 can include an output-gate-control unit 132 for applying voltage to the gate electrode of the output transistor PTr, and an output-drain-control unit 134 for applying voltage to the drain region of the output transistor PTr. Furthermore, the row-control circuit 130 includes a clear-gate-control unit 136 for applying voltage to the gate electrode of the clear transistor CTr, and a clear-drain-control unit 138 for applying voltage to the drain region of the clear transistor CTr. In the present embodiment, however, the drain voltage of the output transistor PTr is maintained at about 3.3V, while the drain voltage of the clear transistor CTr is maintained at ground potential (about 0V). The row-control circuit 130 therefore controls only the gate voltage of the output transistor PTr and the gate voltage of the clear transistor CTr in practice.

The column-control circuit 140 can include a line memory 142 for an accumulation signal, a line memory 144 for an offset signal, and a horizontal shift register 146. The column-control circuit 140, at the time of a reading-out state, reads out signal voltage that is obtained reflecting the number of accumulated holes. The output circuit 150 amplifies the signal voltage applied from the column-control circuit 140 so as to output it as pixel data.

Specifically, the column-control circuit 140 reads out two kinds of signal voltages from each of the pixels so as to provide them to the output circuit 150. One of the signal voltages is a voltage depending on the intensity of incident light. The other of the signal voltages is a voltage depending on the number of holes that remain in the hole pocket after holes accumulated therein were cleared. In the present specification, this voltage, which includes a noise component, is referred to as offset voltage. Then, the output circuit 150 amplifies the difference between these two kinds of signal voltages so as to output it as pixel data.

Figure 3:
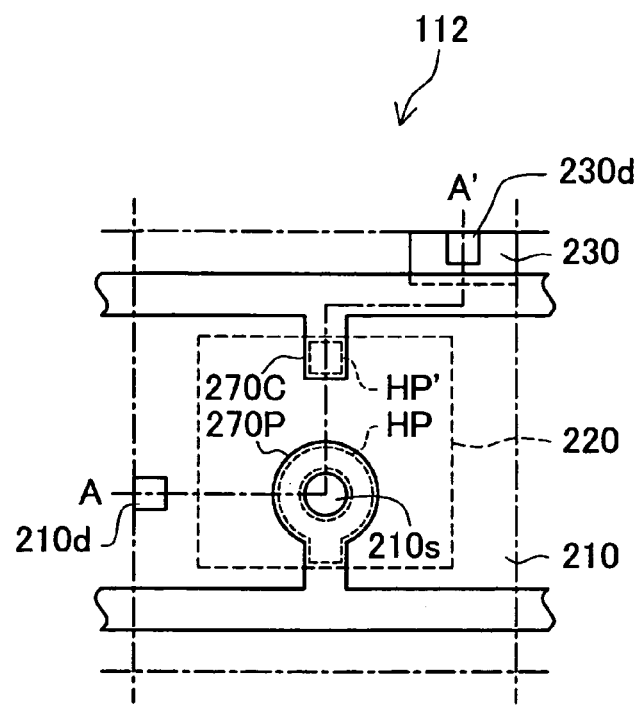
FIG. 3 is an explanatory diagram graphically showing the layout of one of pixels 112.
Figure 4:
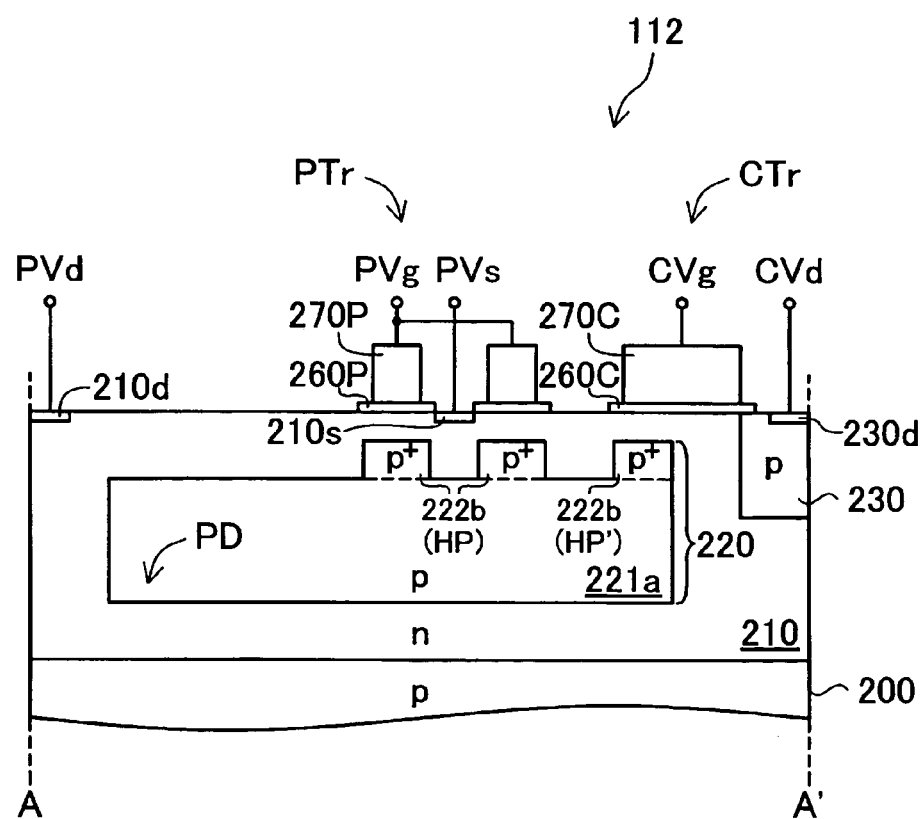
FIG. 4 is an explanatory diagram graphically showing the sectional view of one of the pixels 112.

FIG. 3 is an explanatory diagram graphically showing the layout of one of the pixels 112. FIG. 4 is an explanatory diagram graphically showing a sectional view of one of the pixels 112. Here, FIG. 4 shows a sectional view along the A–A' line of FIG. 3.

The pixels 112 are formed on a semiconductor substrate 200 of a p-type (FIG. 4). An n-region 210 composed of n-type semiconductor is formed on the substrate 200, and a p-region 220 composed of p-type semiconductor is buried inside the n-region 210. Namely, the p-region 220 is a floating region, which does not have an electrical contact point directly coupled to the outside. The p-region 220 includes a p-region 221a that is formed at a relatively deep position and that has a relatively low impurity concentration, and a p-region 222b that is formed at a relatively shallow position and that has a relatively high impurity concentration. In addition, a p-region 230 is formed in the n-region 210.

A junction part between the n-region 210 and the p-region 220 forms the photo diode PD.

The output transistor PTr (FIG. 4) is a depletion type n-channel MOS transistor. The output transistor PTr is formed on a semiconductor substrate whose surface has the n-region 210 provided thereon. In order to suppress the generation of holes causing noise by filling the trap level existing in the surface of the semiconductor substrate with electrons, an n-region is formed on the surface of the semiconductor substrate. A substantially annular output gate 270P is formed over the n-region 210 through a substantially annular gate oxide film 260P. The inside of the substantially annular output gate 270P functions as the source region of the output transistor PTr, while the outside thereof functions as the drain region of the output transistor PTr. Meanwhile, the p-region 220 formed below the output gate 270P is an electrically floating region surrounded by the n-region, and functions as a region (a substrate region) that applies substrate potential to the output transistor PTr. In FIGS. 3 and 4, a source contact region 210s and a drain contact region 210d are shown. These regions are coupled to a metal wiring and have relatively high impurity concentrations. Although FIGS. 3 and 4 show the case where the drain contact region 210d is formed in one of the pixels 112, it may be formed for the plurality of pixels 112 in common.

The hole pocket HP is formed of the p-region (p+-region) 222b whose impurity concentration is relatively high. The hole pocket HP has a substantially annular shape and is formed below the substantially annular output gate 270P.

Here, in FIG. 4, the hole pocket HP is represented at a position relatively deep from the surface of the substrate 200 for convenience. Practically, it is formed at a position relatively shallow from the surface of the substrate 200. In addition, although the hole pocket HP is represented so that it has relatively large thickness in the diagram, it practically has relatively small thickness.

The clear transistor CTr (FIG. 4) is an enhancement type p-channel MOS transistor. A clear gate 270C is formed over the n-region 210 through a gate oxide film 260C. The first p-region 220, which includes the hole pocket HP, functions as the source region of the clear transistor CTr. The second p-region 230, which faces the first p-region 220 through the clear gate 270C, functions as the drain region of the clear transistor CTr. Meanwhile, the n-region 210 formed below the clear gate 270C functions as the substrate region of the clear transistor CTr. In FIGS. 3 and 4, a drain contact region 230d that is coupled to a metal wiring and whose impurity concentration is relatively high, is shown. In addition, a region HP' is formed below the clear gate 270C. The region HP' is formed of the second partial p-region (p+-region) 222b, whose impurity concentration is relatively high, as with the hole pocket HP. The region HP' is a feature that remains through the manufacturing process described below, and can be omitted.

The voltage of the substrate 200 is maintained at ground potential (about 0V). Meanwhile, the drain voltage of the output transistor PTr is maintained at about 3.3V as previously described. In the present embodiment, therefore, the n-region 210 functions as a pixel-isolating region that suppresses electrical interference between pixels adjacent to each other.

The p-region 220 of the present embodiment functions as the hole pocket HP as well as the anode of the photo diode PD as previously described. In addition, the p-region 220 functions as the source region of the clear transistor CTr as well as the substrate region of the output transistor PTr. Such a structure enables the structure of the pixel to be simplified.

As is apparent from the above explanation, the n-region 210, the first p-region 220, and the second p-region 230 of the present embodiment correspond to the pixel-forming region, the buried region, and the discharging region of the present invention, respectively.

Figure 5:
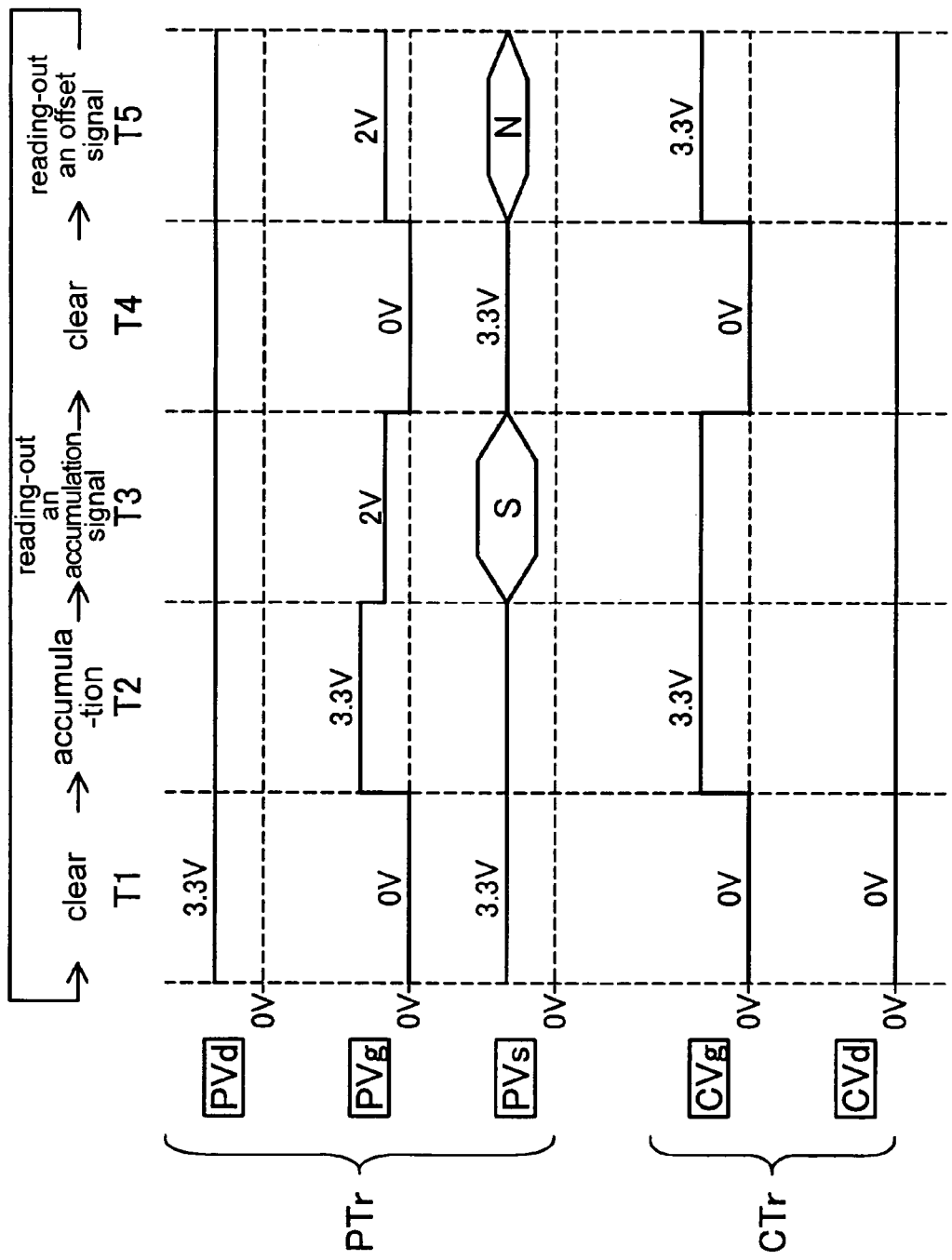
FIG. 5 is an explanatory diagram showing the operational sequence of the pixels 112.

B. Operation of Solid-State Imaging Device:

FIG. 5 is an explanatory diagram showing the operational sequence of the pixels 112. As shown in the diagram, one time of the operational sequence is completed through a first clear period Ti, an accumulation period T2, a reading-out period T3 for an accumulation signal, a second clear period T4, and a reading-out period T5 for an offset signal. Two clear periods T1 and T4 are periods for discharging holes from the hole pocket HP. The accumulation period T2 is a period for accumulating holes in the hole pocket HP. Two reading-out periods T3 and T5 are periods for reading out a signal depending on the number of holes existing in the hole pocket HP.

In the present embodiment, drain voltage PVd of the output transistor PTr is consistently maintained at about 3.3V, while drain voltage CVd of the clear transistor CTr is consistently maintained at about 0V as previously described. The way of controlling the transistors PTr and CTr during the clear period Ti is the same as that during the clear period T4, and the way of controlling the transistors T3 and T5 during the reading-out period T3 is the same as that during the reading-out period T5.

Figure 6:
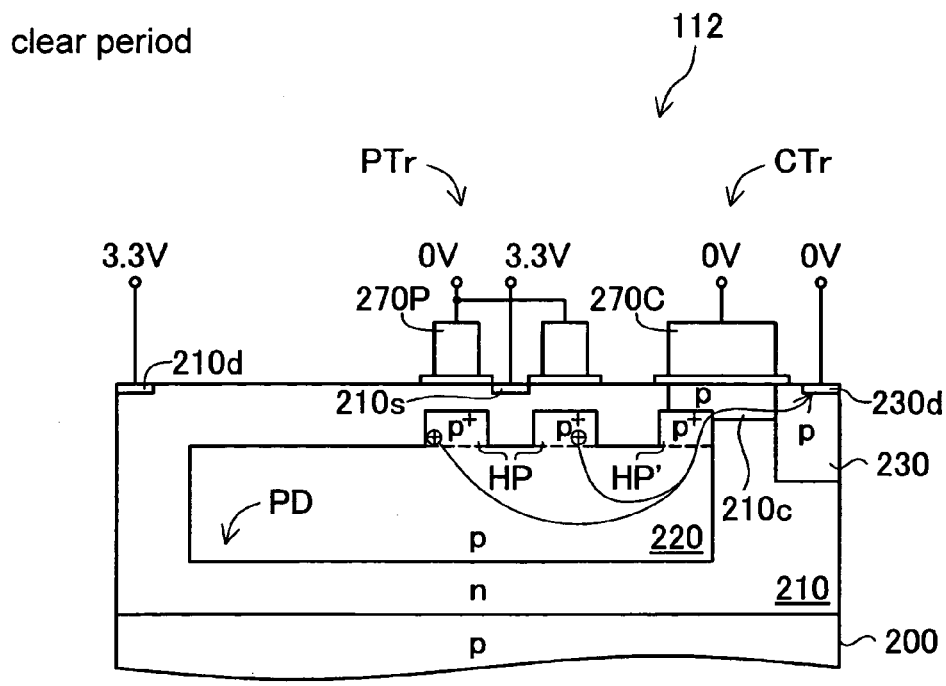
FIG. 6 is an explanatory diagram showing the internal state of one of the pixels 112 during a first clear period T1.

B-1. Clear Period:

FIG. 6 is an explanatory diagram showing the internal state of one of the pixels 112 during the first clear period T1. In the first clear period T1, gate voltage PVg and source voltage PVs of the output transistor PTr are set to be about 0V and about 3.3V, respectively, as shown in FIG. 5. At this time, the output transistor PTr is set to be in an "off" state. Meanwhile, gate voltage CVg of the clear transistor CTr is set to be about 0V. At this time, the clear transistor CTr is set to be in an "on" state. This is because the substrate voltage of the clear transistor CTr (namely, the voltage of the n-region 210 below the clear gate 270C) is almost equal to the drain voltage PVd (about 3.3V) of the output transistor PTr.

In the clear period T1, a channel region 210c is formed below the clear gate 270C. Holes existing in the hole pocket HP therefore pass through the first p-region 220, the channel region 210c, and the second p-region 230 so as to be discharged from the drain contact region 230d.

The operation during the fourth clear period T4 (FIG. 5) is the same as that during the first clear period T1. The first clear period T1, however, is set in order to discharge holes that may remain in the hole pocket HP slightly preceding the accumulation period T2, while the second clear period T4 is set in order to discharge holes that are accumulated in the hole pocket HP during the accumulation period T2.

Figure 7:
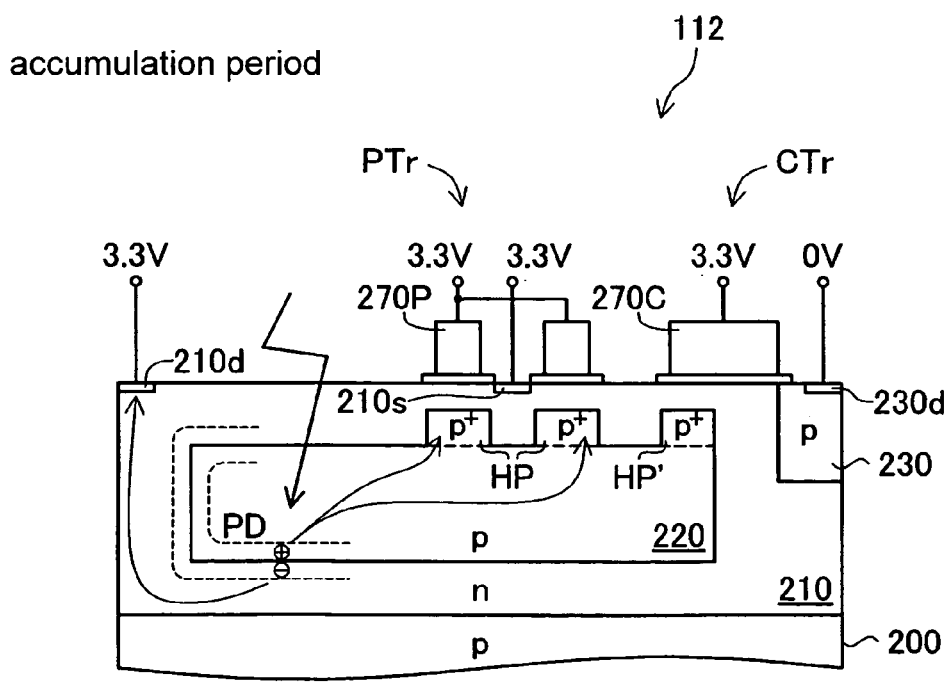
FIG. 7 is an explanatory diagram showing the internal state of one of the pixels 112 during an accumulation period T2.

B-2. Accumulation Period:

FIG. 7 is an explanatory diagram showing the internal state of one of the pixels 112 during the accumulation period T2. In the accumulation period T2, the gate voltage PVg of the output transistor PTr is changed as shown in FIG. 5. Specifically, the gate voltage PVg is set to be about 3.3V. At this time, the output transistor PTr is set to be in an "on" state. In addition, the gate voltage CVg of the clear transistor CTr is also changed. Specifically, the gate voltage CVg is set to be about 3.3V. At this time, the clear transistor CTr is set to be in an "off" state.

If the output transistor PTr is set to be in an "on" state as described above, an electronic layer can be induced in the interface of the gate oxide film. As a result, the generation of dark currents attributed to interface defects can be suppressed.

In the accumulation period T2, a depletion region (for example, a region sandwiched between two dashed lines of FIG. 7) is formed in the vicinity of the junction interface between the n-region 210 and the p-region 220 that form the photo diode PD. When light enters the photo diode PD, pairs of electrons and holes are generated by photoelectrical conversion. Electrons pass through the n-region 210 so as to be discharged from the drain contact region 210d. Meanwhile, holes are collected in the hole pocket HP in the p-region 220 so as to be accumulated. This is because the hole pocket HP has a relatively high impurity concentration such that it has relatively low potential against holes.

Here, holes are also accumulated in the region HP' while accumulated in the hole pocket HP. However, the ratio between the number of holes in the hole pocket HP and the number of holes in the region HP' is regarded as being almost constant. Even when the region HP' exists, therefore, the output transistor PTr can output a signal depending on the intensity of incident light.

Figure 8:
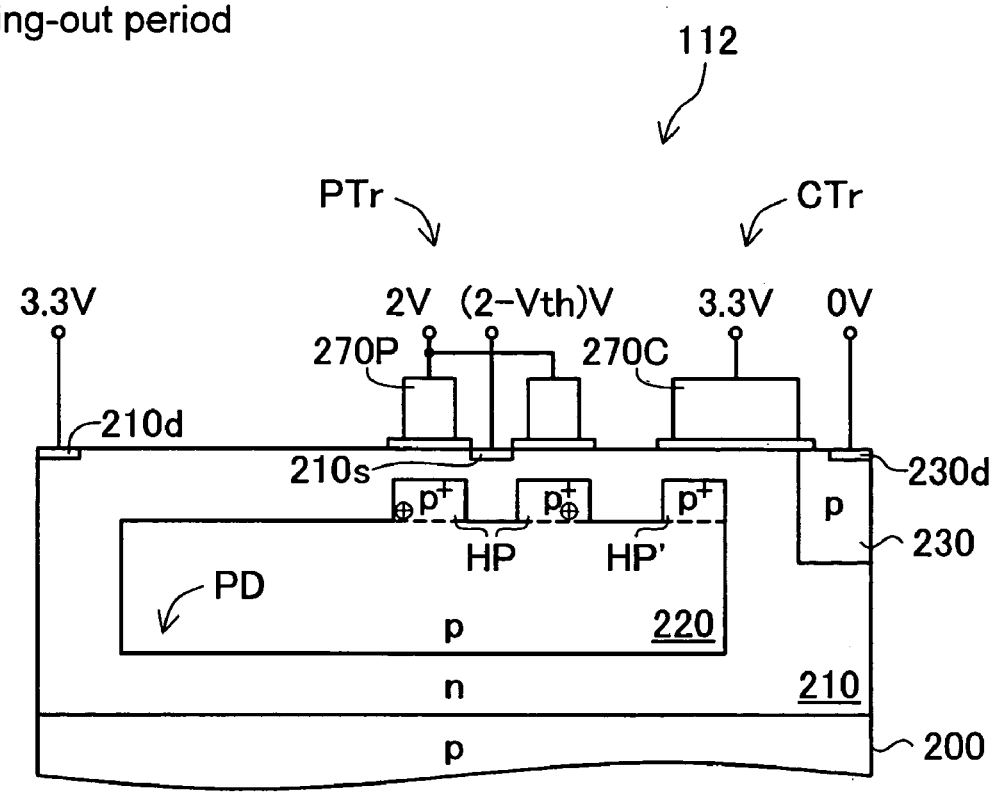
FIG. 8 is an explanatory diagram showing the internal state of one of the pixels 112 during a reading-out period T3 for an accumulation signal.

B-3. Reading-Out Period:

FIG. 8 is an explanatory diagram showing the internal state of one of the pixels 112 during the reading-out period T3 for an accumulation signal. In the reading-out period T3 for an accumulation signal, the gate voltage PVg of the output transistor PTr is changed as shown in FIG. 5. Specifically, the gate voltage PVg is set to be about 2V, which is lower than the drain voltage PVd (about 3.3V). In addition, the output transistor PTr operates as a source follower in the reading-out period T3 for an accumulation signal. Then, accumulation voltage (an accumulation signal) depending on the number of holes accumulated in the hole pocket HP is read out from the source region of the output transistor PTr.

In the reading-out period T3 for an accumulation signal, holes are maintained at a state of being accumulated in the hole pocket HP. The source voltage PVs of the output transistor PTr is represented by a formula PVs=PVg−Vth, where Vth is the threshold voltage of the output transistor PTr. The threshold voltage Vth changes depending on the number of holes accumulated in the hole pocket HP. Specifically, the larger the number of accumulated holes is, the lower the threshold voltage Vth becomes. Meanwhile, the lower the threshold voltage Vth is, the higher the source voltage PVs becomes. Namely, the larger the number of holes accumulated in the hole pocket HP is, in other words, the higher the intensity of light entering the photo diode PD is, the higher the source voltage PVs becomes.

The operation during the reading-out period T5 for an offset signal (FIG. 5) is the same as that during the reading-out period T3 for an accumulation signal. In the reading-out period T5 for an offset signal, however, offset voltage (an offset signal) of a state where holes scarcely exist in the hole pocket HP is output from the source region of the output transistor PTr. The output circuit 150 (FIG. 1) amplifies difference between read-out two signals (namely, an accumulation signal and an offset signal) so as to output pixel data from which a noise component is removed.

Here, although the second clear period T4 and the reading-out period T5 for an offset signal are included in one time of the operational sequence in the present embodiment as shown in FIG. 5, these two periods T4 and T5 may be omitted. In this case, the output circuit 150 (FIG. 1) may obtain pixel data from difference between a read-out accumulation signal and a predetermined offset signal that is previously prepared. Otherwise, the output circuit 150 may obtain pixel data from only a read-out accumulation signal.

As described above, the solid-state imaging device 100 of the present embodiment includes the pixel array 110 having the plurality of pixels 112 arranged in a matrix. In addition, each of the pixels includes the photo diode PD for generating holes according to the intensity of incident light, and the hole pocket HP for accumulating the generated holes. Each of the pixels also includes the output transistor PTr for outputting a signal according to the threshold voltage that changes depending on the number of holes accumulated in the hole pocket, and the clear transistor CTr for discharging holes accumulated in the hole pocket. Thus, in the solid-state imaging device 100 of the present embodiment, each of the pixels 112 has the clear transistor CTr such that holes in the hole pocket can be easily discharged through the channel region 210c of the clear transistor CTr.

Each of the pixels heretofore does not have the clear transistor as previously described. For this reason, holes heretofore were discharged toward the depth direction of the substrate 200 by applying relatively high voltage (for example, from about 5V to about 7V) to the gate electrode of the output transistor PTr. Namely, the row-control circuit 130 (FIG. 1) heretofore was required to generate relatively high voltage.

On the other hand, in the present embodiment, holes can be discharged through the channel region 210c formed in the vicinity of the surface of the substrate 200 by only controlling the clear transistor with relatively low voltage, since each of the pixels includes the clear transistor CTr. Holes in the hole pocket HP therefore can be easily discharged.

Meanwhile, in the case where holes accumulated in the hole pocket HP are discharged toward the depth direction of the substrate 200, as is conventionally done, there is a problem that residual images and white defects are caused due to the existence of the n-region 210 below the p-region 220 (it is simply referred to as lower region hereinafter). Here, residual image means a phenomenon where holes that were accumulated in previous imaging are not sufficiently discharged such that previous image information remains in the present image. In addition, white defect means a phenomenon where holes enter the hole pocket so as to cause output pixel data to show white.

Specifically, when the height of the barrier of the lower region is relatively high (namely, the n-region has a relatively high impurity concentration), and the width of the barrier thereof is relatively large (namely, the n-region has a relatively large thickness), it is difficult to discharge holes toward the depth direction of the substrate 200 over the barrier of the n-region 210. At this time, holes remain in the hole pocket HP so as to cause residual images. Meanwhile, when the height of the barrier of the lower region is relatively low (namely, the n-region has a relatively low impurity concentration), and the width of the barrier thereof is relatively small (namely, the n-region has a relatively small thickness), holes tend to enter the p-region 220 from the n-region 210. At this time, holes are accumulated in the hole pocket HP so as to cause white defects. Namely, in a conventional structure, the suppression of the generation of a residual image allows white defects to be generated, while the suppression of the generation of white defects allows a residual image to be generated. It therefore is difficult to suppress both of the generation of a residual image and that of white defects conventionally On the other hand, in the present embodiment, accumulated holes can be discharged through the channel region 210c formed in the vicinity of the surface of the substrate 200, since the clear transistor CTr is provided. Namely, in the present embodiment, there is no need for setting the height and width of the barrier of the lower region relatively small such that those can be set relatively large. The both of the generation of a residual image and that of white defects therefore can be easily suppressed such that image quality can be improved. For example, the impurity concentration of the lower region may be higher than that of the n-region 210 at the side of the p-region 220 (it is simply referred to as side region hereinafter). Instead of this, or, along with this, the thickness of the lower region may be larger than that of the side region (which is almost equal to that of the p-region 220).

C. Method of Manufacturing Solid-State Imaging Device:

FIGS. 9 through 12 are explanatory diagrams schematically showing the manufacturing process of the solid-state imaging device 100 (FIG. 1). Each of the diagrams, however, is represented with focus on manufacturing process of the pixels 112 of FIG. 4.

Figure 9A:
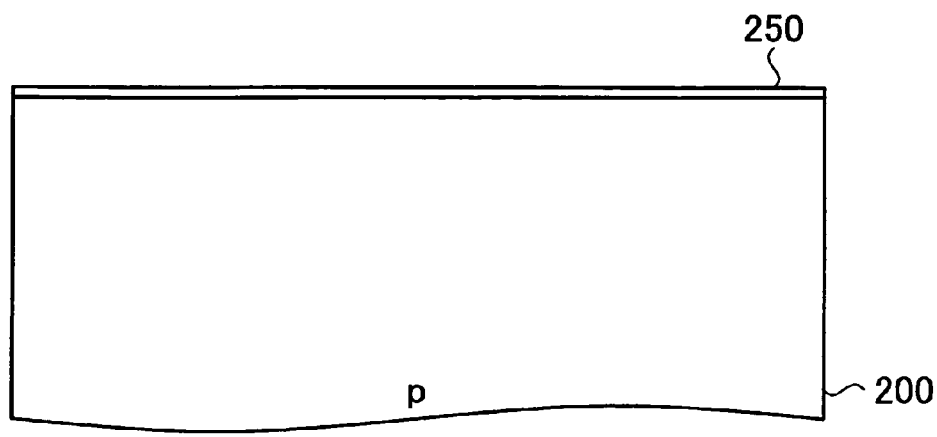
FIG. 9 is an explanatory diagram schematically showing a manufacturing process of a solid-state imaging device 100 (FIG. 1)
Figure 9B:
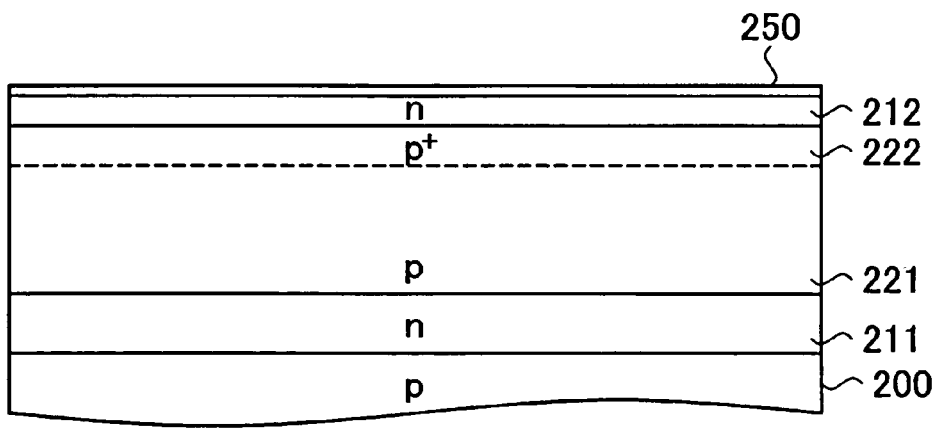
Figure 9C:
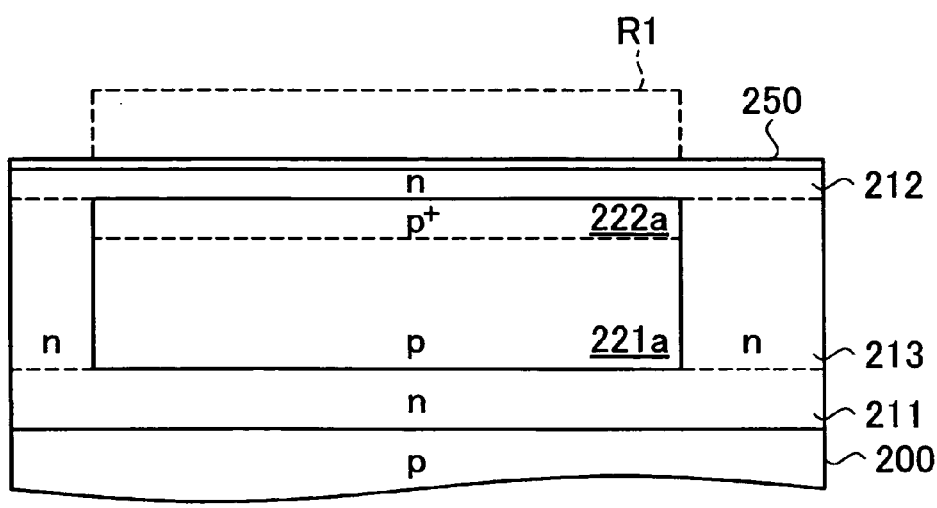

Referring to FIG. 9 (A), the substrate 200 of p-type silicon is prepared first. Then, a first silicon oxide film 250 is formed on the substrate 200 by thermal oxidation. The oxide film 250 is formed in order to suppress the damage of the substrate 200 caused in subsequent processes.

Referring to FIG. 9 (B), impurities are doped in the substrate 200 by ion implantation. In this process, four layers are formed. Specifically, an n-layer 211 is formed as the lowest layer of the four layers by implanting phosphorous (P) ions. A p-layer 221 and a p+-layer 222 are formed on the n-layer 211 by implanting boron (B) ions. The impurity concentration of the p+-layer 222, however, is set to be higher than that of the p-layer 221. An n-layer 212 is formed as the top layer of the four layers by implanting arsenic (As) ions.

Referring to FIG. 9 (C), a substantially rectangle first resist R1 is formed. Next, an impurity is doped in the substrate 200 by implanting ions as the first resist R1 being a mask. Specifically, implanting phosphorous (P) ions forms an n-region 213 in the peripheral part, while retaining the p-region 221a and a p+-region 222a in the center part. Thereafter, the first resist R1 is removed.

Here, two n-layers 211 and 212, and the n-region 213 of FIG. 9 (C) form the n-region 210 shown in FIG. 4. The p-region 221a and the p+-region 222a of FIG. 9 (C) form the first p-region 220 shown in FIG. 4.

Figure 10A:
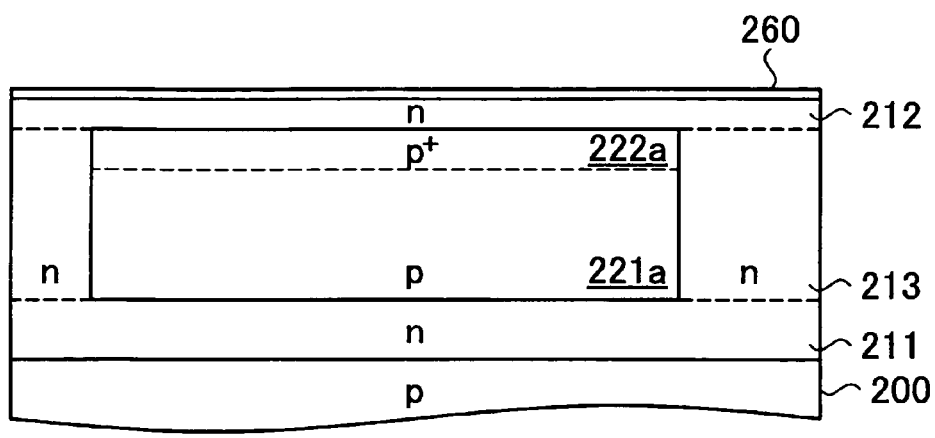
FIG. 10 is an explanatory diagram schematically showing the manufacturing process of the solid-state imaging device 100 (FIG. 1)
Figure 10B:
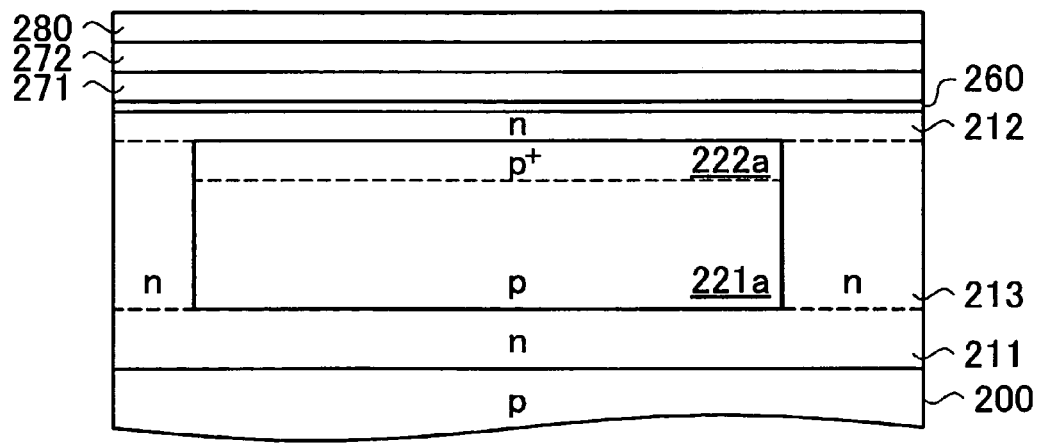
Figure 10C:
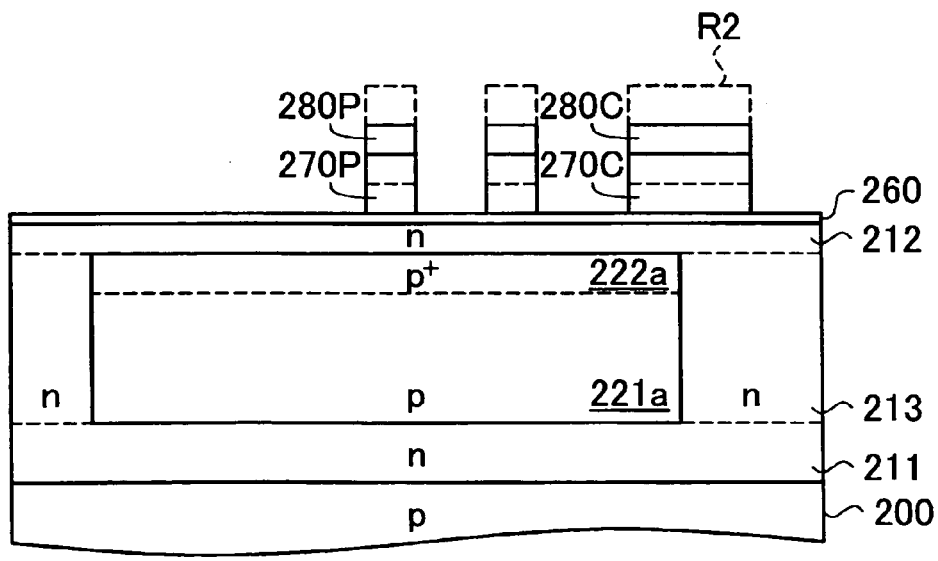

Referring to FIG. 10 (A), the first silicon oxide film 250 is removed first. Then, a second silicon oxide film 260 is formed on the substrate 200 by thermal oxidation.

The second silicon oxide film 260 of FIG. 10 (A) forms the gate oxide films 260P and 260C of the transistors PTr and CTr shown in FIG. 4.

Referring to FIG. 10 (B), first, a poly silicon layer 271 is deposited on the second oxide film 260 by low-pressure CVD. Then, a tungsten silicide (W—Si) layer 272 is formed on the poly silicon layer 271 by sputtering. Furthermore, a third silicon oxide film 280 is deposited on the W—Si layer 272 by low-pressure CVD. The third oxide film 280 is formed in order to prevent impurity ions from being reflected by the W—Si layer 272 in subsequent ion implantation.

The two layers 271 and 272 of FIG. 10 (B) form the gate electrodes 270P and 270C of the transistors PTr and CTr shown in FIG. 4.

Referring to FIG. 10 (C), a second resist R2 is formed first. Then, etching is implemented as the second resist R2 being a mask. In this process, the gate electrode 270P of the output transistor PTr and the gate electrode 270C of the clear transistor CTr are formed. The oxide films 280P and 280C are left on the gate electrodes 270P and 270C. Thereafter, the second resist R2 is removed.

Figure 11A:
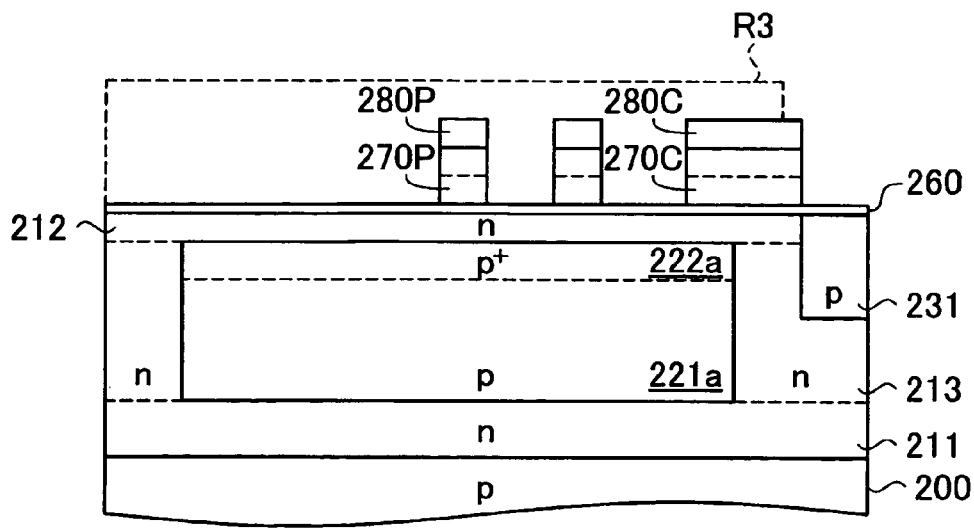
FIG. 11 is an explanatory diagram schematically showing the manufacturing process of the solid-state imaging device 100 (FIG. 1)
Figure 11B:
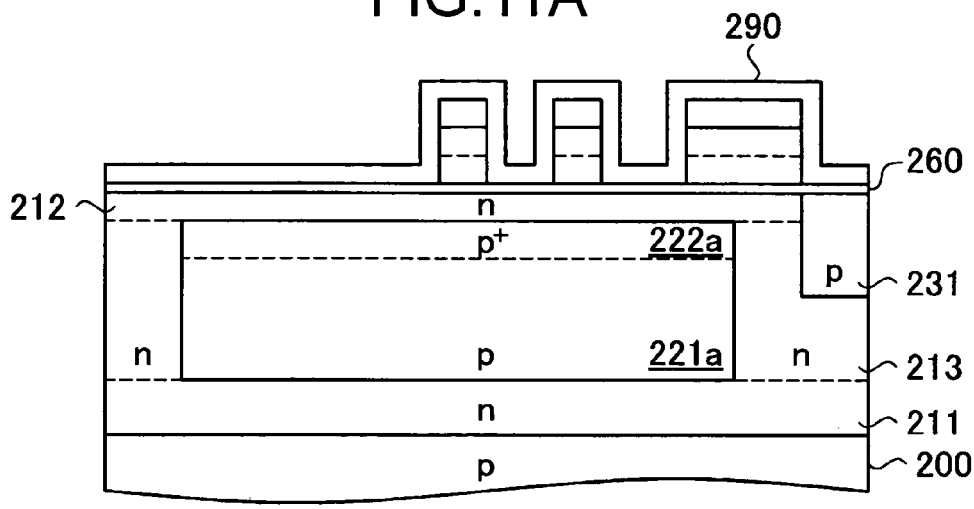
Figure 11C:
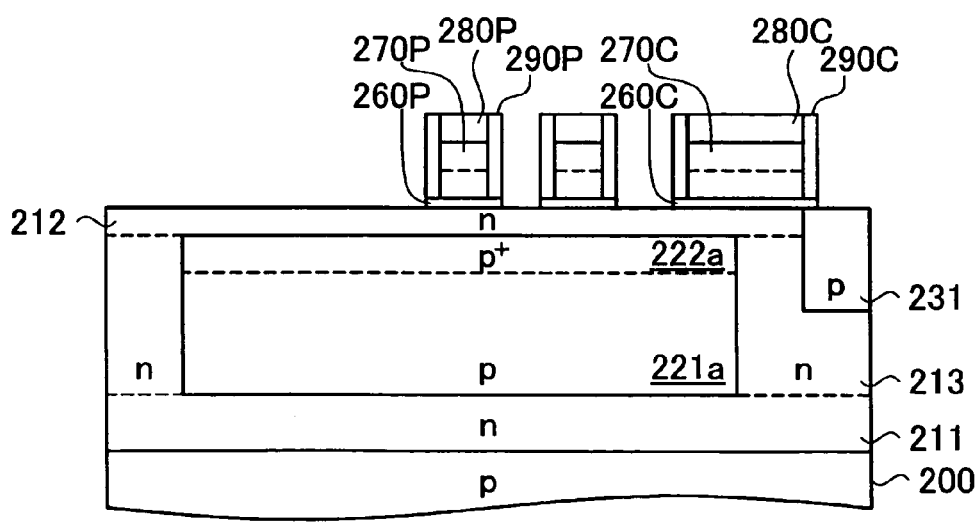

Referring to FIG. 11 (A), a third resist R3 is formed first. Next, an impurity is doped in the substrate 200 by implanting ions as the third resist R3 and the clear gate 270C (more specifically, the oxide film 280C on the clear gate 270C) being masks. Specifically, a p-region 231 is formed in the n-region 213 adjacent to the clear gate 270C by implanting boron (B) ions. Thereafter, the third resist R3 is removed.

Referring to FIG. 11 (B), a fourth silicon oxide film 290 is deposited by low-pressure CVD.

Referring to FIG. 11 (C), anisotropy etching, such as reactive ion etching (RIE), is implemented. Etching is implemented to the extent that the second oxide film 260 at the periphery of the gate electrodes 270P and 270C is completely removed. In this process, the gate oxide films 260P and 260C are formed under the gate electrodes 270P and 270C, while side walls 290P and 290C are formed at the side of the gate electrodes 270P and 270C, respectively.

Figure 12A:
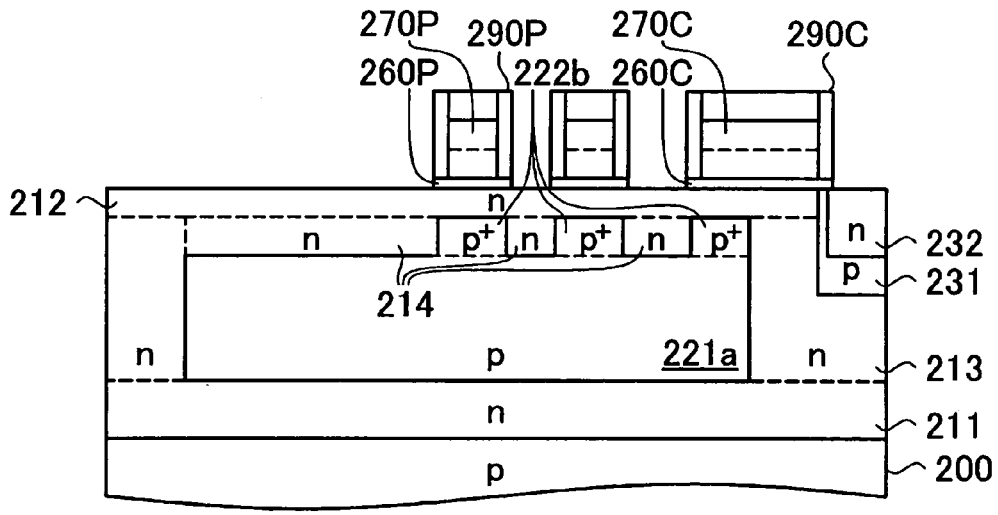
FIG. 12 is an explanatory diagram schematically showing the manufacturing process of the solid-state imaging device 100 (FIG. 1)
Figure 12B:
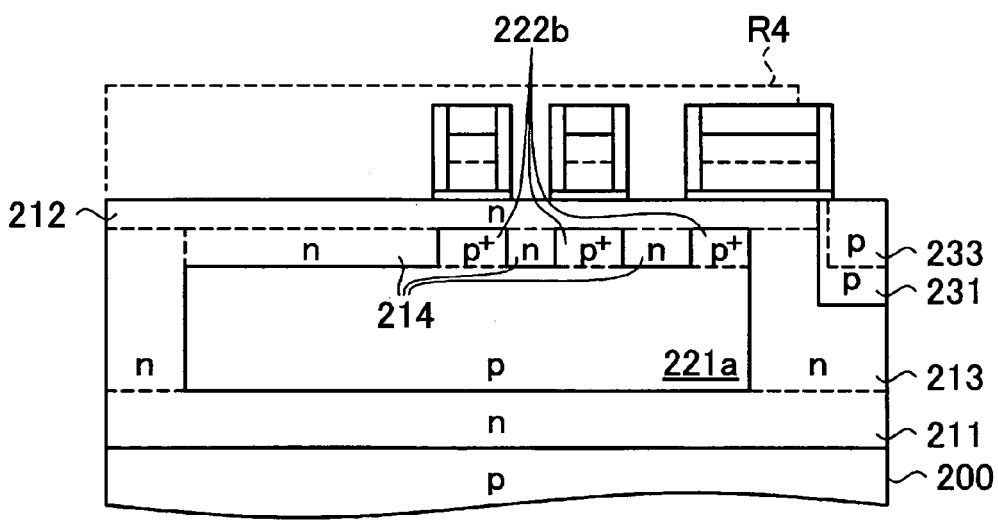
Figure 12C:
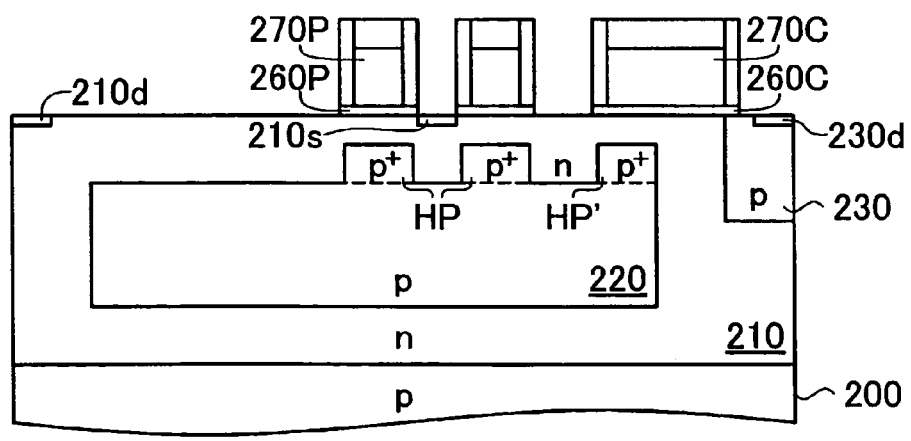

Referring to FIG. 12 (A), an impurity is doped in the substrate 200 by implanting ions as gate electrode sections of two transistors PTr and CTr (more specifically, the oxide films 280P and 280C on the gate electrodes 270P and 270C, and the side walls 290P and 290C of the gate electrodes 270P and 270C) being masks. Specifically, implanting phosphorous (P) ions allows the conductivity type of a part of the p+-region 222a (FIG. 11 (C)) to be inverted so as to form n-regions 214. Meanwhile, the p+-region 222b is left below the gate electrode sections. At this time, an n-region 232 is also formed in the p-region 231 adjacent to the clear gate 270C.

The p+-region 222b left below the output gate 270P of FIG. 12 (A) forms the hole pocket HP shown in FIG. 4, while the p+-region 222b left below the clear gate 270C forms the region HP'.

Referring to FIG. 12 (B), a fourth resist R4 is formed first. The fourth resist R4 has the same shape as that of the third resist R3 (FIG. 11(A)). Next, an impurity is doped in the substrate 200 by implanting ions as the fourth resist R4 and the clear gate 270C (more specifically, the oxide film 280C on the clear gate 270C) being masks. Specifically, implanting boron (B) ions in the n-region 232 formed in FIG. 12 (A) allows the conductivity type of the n-region 232 to be inverted so as to form a p-region 233. Thereafter, the fourth resist R4 is removed.

The two p-regions 231 and 233 of FIG. 12 (B) form the second p-region 230 shown in FIG. 4.

A pixel structure shown in FIG. 12 (C) is manufactured through processes like the above. In FIG. 12 (c), the contact regions 210s, 210d, and 230d to which metal wirings are coupled in a subsequent metal wiring process, are formed. The process of forming the contact regions may be implemented in the middle of the above-described processes, or may be implemented just before the metal wiring process. Here, the drain contact region 210d of the output transistor PTr is provided for a plurality of pixels in common practically as previously described.

As described above, the manufacturing process of the present embodiment can include following steps: (a) the step of preparing the substrate 200 of p-type semiconductor that has the n-region 210 and the p-region 220 formed in the n-region 210 (FIGS. 9 (A) through 9 (C)); (b) the step of forming the output gate 270P and the clear gate 270C over the n-region 210 through the gate oxide films 260P and 260C (FIGS. 10 (A) through 11 (C)); (c) the step of leaving the hole pocket HP that has a relatively high impurity concentration below the output gate 270P by doping an impurity in the p+-region 222a with utilizing a region including the output gate 270P as a mask, the impurity being capable of inverting the conductivity type of the p+-region 222a (FIG. 12 (A)); and (d) the step of forming the p-region 230 into which holes discharged from the hole pocket HP flow, in the n-region 210. This method enables the solid-state imaging device 100 shown in FIG. 4 to be manufactured.

In addition, in the present embodiment, the hole pocket HP is formed below the output gate 270P in a self-aligned manner, since a region including the output gate 270P is utilized as a mask as shown in FIG. 12 (A). Thus, the relationship between the positions of the output gate 270P and the hole pocket HP, which are included in each of the pixels 112, can be almost constant. If the relationship between the positions of the output gate and the hole pocket included in each of the pixels is incorrect, the number of accumulated holes is not effectively reflected in the amount of change of the threshold value such that image quality is deteriorated. In the present embodiment, however, the deterioration of image quality can be avoided since the hole pocket is self-aligned.

In addition, in the present embodiment, the n-region 213, which surrounds the p-region 221a and the p+-region 222a, is formed in the initial process. Therefore, the width of the n-region 213, which functions as a pixel-isolating region, can be kept constant. As a result, the fluctuation of sensitivity attributed to the increase and decrease of the width of the n-region 213 can be avoided.

Figure 13:
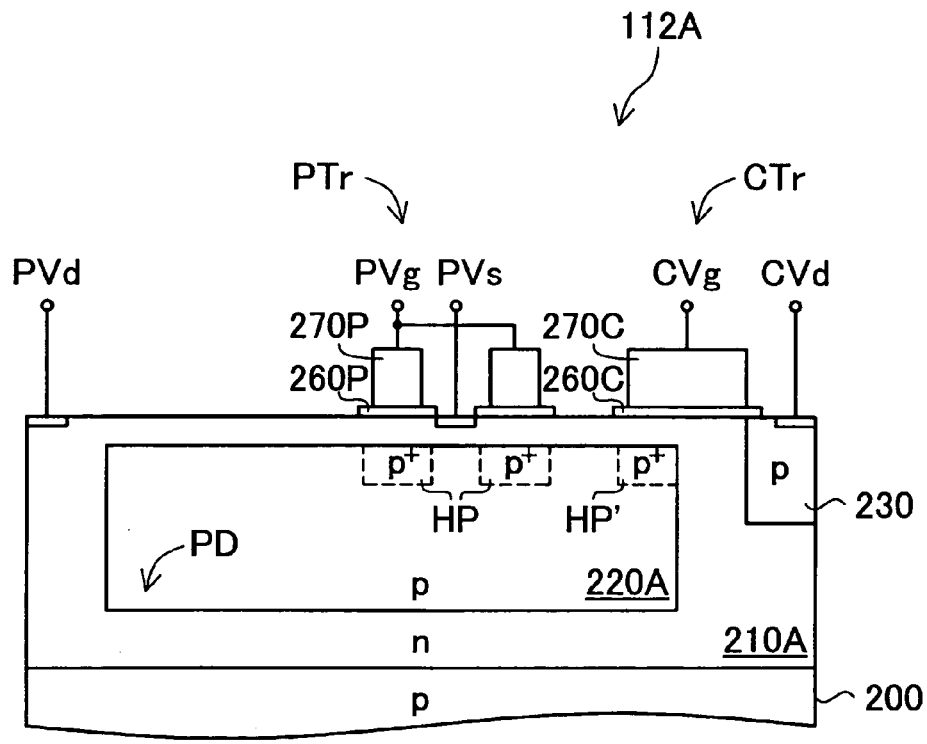
FIG. 13 is an explanatory diagram showing a first modification of the pixel structure.

D. Modifications of Pixel Structure:

FIG. 13 is an explanatory diagram showing a first modification of the pixel structure. FIG. 13 is almost same as FIG. 4. In pixels 112A, however, the sectional shapes of an n-region 210A and a first p-region 220A are different from those of the n-region 210 and the first p-region 220 of the pixels 112. Specifically, in the first p-region 220 of FIG. 4, n-regions are formed at the side of the hole pocket HP (and the region HP'), while in the first p-region 220A of FIG. 13, p-regions are formed at the side of the hole pocket HP (and the region HP'). This structure can be manufactured by, for example, reducing the impurity concentration of phosphorous (P) ions that are implanted in the process of FIG. 12 (A).

Even when the structure of FIG. 13 is employed, the pixels 112A can operate similarly to the pixels where the structure of FIG. 4 is employed. In the structure of FIG. 4, however, there is an advantage that the sensitivity of the pixels can be more enhanced since holes can be more localized in the hole pocket HP.

Figure 14:
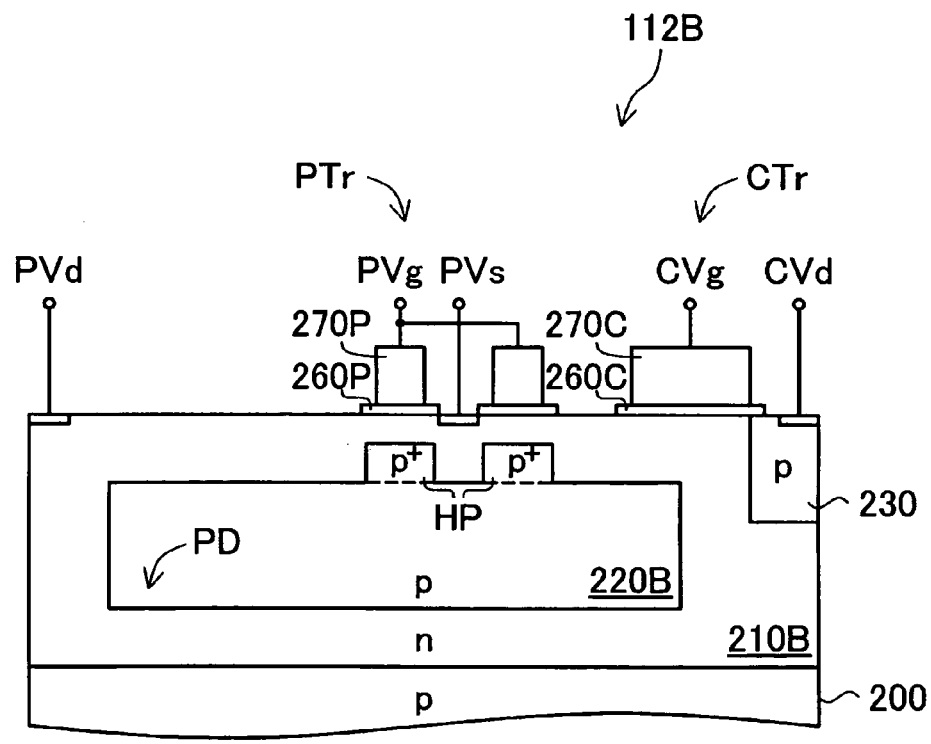
FIG. 14 is an explanatory diagram showing a second modification of the pixel structure.

FIG. 14 is an explanatory diagram showing a second modification of the pixel structure. FIG. 14 is almost same as FIG. 4. In pixels 112B, however, the sectional shapes of an n-region 210B and a first p-region 220B are different from those of the n-region 210 and the first p-region 220 of the pixels 112. Specifically, in the first p-region 220 of FIG. 4, the region HP' is formed below the clear gate 270C, while in the first p-region 220B of FIG. 14, it is not formed. This structure can be manufactured by, for example, adding two processes between the process of FIG. 9 (C) and the process of FIG. 10 (A). These two processes are the process of forming a resist that has an opening in a region where the clear gate 270C is formed, and the process of implanting phosphorous (P) ions in the p+-region 222a. This method enables an n-region to be formed in the p+-region 222a so as to prevent the forming of the region HP'.

Even when the structure of FIG. 14 is employed, the pixels 112A can operate similarly to the pixels where the structure of FIG. 4 is employed. In the structure of FIG. 14, there is an advantage that the sensitivity of the pixels can be more enhanced since holes are not accumulated in the region HP'.

Thus, it should be appreciated that the solid-state imaging device can employ a variety of structures and manufacturing methods.

In addition, it should be understood that the present invention is not limited to the above-described embodiments, but can be applied to various kinds of modifications without departing from the scope and spirit of the present invention. For example, the following modifications are available.

Although the n-region 210 functions as a pixel-isolating region in the above described embodiment, isolating features, such as p-n junction and a dielectric that isolate pixels may be further added. This structure is suitable for, for example, changing the drain voltage of the output transistor PTr.

Although n-regions and p-regions included in the pixels 112 are formed by inverting the conductivity types of semiconductor with utilizing ion implantation in the embodiment, instead of this, these regions are formed by epitaxial growth.

Although the output transistor PTr has the substantially annular gate electrode 270P in the embodiment, instead of this, it may have a substantially rectangular gate electrode. In the embodiment, however, there is an advantage that the structure of pixels can be simplified. In addition, the substantially annular gate electrode has a substantially circular outer periphery and a substantially circular inner periphery in the embodiment, instead of this, it may have a substantially polygonal outer periphery and a substantially polygonal inner periphery. Otherwise, it may have a substantially polygonal outer periphery and a substantially circular inner periphery. Namely, substantially annular has only to be a closed shape.

Although each of the transistors PTr and CTr includes an oxide film as a gate insulating film in the embodiment, instead of this, it may have a nitride film.

In addition, although each of the transistors PTr and CTr includes a gate electrode formed of poly silicon and tungsten silicide in the embodiment, instead of this, it may have a gate electrode formed of only metal material.

Generally, it is sufficient that each of the pixels includes an insulated-gate output transistor and an insulated-gate clear transistor.

Although holes are accumulated in the accumulation region in the embodiment, instead of this, electrons may be accumulated. In this case, a p-type semiconductor region and an n-type semiconductor region may be replaced with each other.

Although each of the pixels includes the clear gate for discharging holes accumulated in the hole pocket in the embodiment, each of the pixels may further include an overflow drain gate having a function of suppressing a blooming phenomenon. Specifically, if light with strong intensity enters a part of pixels, a part of generated holes may spill from the p-region 220 so as to flow into the p-region 220 of adjacent pixels. Then, the adjacent pixels output pixel data showing that light enters them, even though light does not enter (blooming phenomenon). Using an overflow gate, however, enables spilled holes to be discharged toward a substrate and the like through another paths so as to avoid a blooming phenomenon.

The overflow drain gate is provided, for example, at a position facing the clear gate through the photo diode PD. In addition, the clear gate is positioned relatively close to the hole pocket, while the overflow drain gate is positioned relatively far from the hole pocket. Specifically, the shortest distance between the clear gate and the hole pocket is preferably set to be, for example, equal to or less than 0.6 mm, and is more preferably set to be about 0.3 mm.

What is claimed is:
1. A solid-state imaging device, comprising:
a pixel array having a plurality of pixels arranged in a matrix;
each of the pixels including:
    a photo diode that generates carriers depending on the intensity of incident light;
    an accumulation region that accumulates the generated carriers;
    an insulated-gate output transistor that outputs a signal according to a threshold voltage that changes depending on a number of the carriers accumulated in the accumulation region; and
    an insulated-gate clear transistor that discharges the carriers accumulated in the accumulation region, the accumulated carriers being discharged through a channel region of the clear transistor, and
the pixels each further including:
a pixel-forming region of a second conductivity type that is formed on a semiconductor substrate of a first conductivity type and where one of the pixels is formed;
a buried region of a first conductivity type that is formed in the pixel-forming region and that includes a first partial buried region formed at a relatively deep position and having a relatively low impurity concentration and a second partial buried region formed at a relatively shallow position and having a relatively high impurity concentration, a junction region between the first partial buried region and the pixel-forming region forming the photo diode, the second partial buried region forming the accumulation region; and a discharging region of a first conductivity type that is formed in the pixel-forming region and into which carriers discharged from the accumulation region flow;

an output transistor that includes a first gate electrode that is formed over the pixel-forming region above the accumulation region through an insulating film; and the clear transistor including a second gate electrode that is formed over the pixel-forming region between the buried region and the discharging region.

2. The solid-state imaging device according to claim 1, the accumulation region functioning as a source region of the clear transistor.

3. The solid-state imaging device according to claim 1, the first gate electrode having a substantially annular shape; and the output transistor including:
   a source region that is formed inside the first gate electrode; and
   a drain region that is formed outside the first gate electrode.

4. The solid-state imaging device according to claim 1, the pixel-forming region including:

a lower region that is formed below the buried region; and a side region that is formed at a side of the buried region; and an impurity concentration of the lower region being higher than an impurity concentration of the side region.

5. The solid-state imaging device according to claim 1, the pixel-forming region including:

a lower region that is formed below the buried region; and a side region that is formed at a side of the buried region; and a thickness of the lower region being larger than a thickness of the side region.

6. The solid-state imaging device according to claim 1, the first conductivity type being a p-type;

the second conductivity type being an n-type; and the carriers being holes.

* * * * *